United States Patent [19]

Stranjord et al.

[11] Patent Number: 5,059,783
[45] Date of Patent: Oct. 22, 1991

[54] INTERFEROMETRIC FIBER OPTIC PROXIMITY SWITCH

[75] Inventors: Lee K. Stranjord, Burlington, Mass.; Yellapu Anjan, Scottsdale, Ariz.

[73] Assignee: Honeywell Inc., Minneapolis, Minn.

[21] Appl. No.: 532,787

[22] Filed: Jun. 4, 1990

[51] Int. Cl.⁵ .................. H01J 5/16; G01R 33/02; G01B 9/02
[52] U.S. Cl. ............ 250/227.19; 250/227.21; 356/345; 324/244
[58] Field of Search ........... 250/227.19, 231.1, 227.21, 250/227.22, 229; 356/345; 324/207.11, 207.13, 207.14, 207.22, 207.24, 207.26, 244, 96; 350/96.12, 96.13, 96.11

[56] References Cited

U.S. PATENT DOCUMENTS

| | | | |
|---|---|---|---|
| 4,356,448 | 10/1982 | Brogardh et al. | 324/244 |
| 4,376,248 | 3/1983 | Giallorenzi et al. | 250/227.19 |
| 4,433,291 | 2/1984 | Yariv et al. | 324/244 |
| 4,450,406 | 5/1984 | Bobb | 324/244 |
| 4,471,219 | 9/1984 | Giallorenzi | 250/227 |
| 4,516,073 | 5/1985 | Doriath et al. | 324/244 |
| 4,600,885 | 7/1986 | Koo et al. | 324/244 |
| 4,627,728 | 12/1986 | Willson | 250/227.19 |
| 4,767,210 | 8/1988 | Kashyap | 356/345 |
| 4,789,240 | 12/1988 | Bush | 356/345 |
| 4,796,966 | 1/1989 | Kovaleski et al. | 250/231.1 |
| 4,800,266 | 1/1989 | Poorman | 250/227 |
| 4,816,669 | 3/1989 | Andersen | 356/73.1 |
| 4,881,813 | 11/1989 | Koo et al. | 250/227.19 |
| 4,899,042 | 2/1990 | Falk et al. | 250/227.19 |

Primary Examiner—David C. Nelms
Assistant Examiner—Michael Messinger
Attorney, Agent, or Firm—Gregory A. Bruns

[57] ABSTRACT

A proximity switch for use with a single optical source of energy. A passive fiber-optic magnetometer includes a Michelson type magnetometer in which one of the legs is sensitized to magnetic fields. A fiber-optic data link connects the magnetometer to the single optical source of energy and to a photo detector. A permanent magnet positioned adjacent the magnetometer causes constructive interference which is detected by the photo detector.

14 Claims, 2 Drawing Sheets

INTERFEROMETRIC FIBER OPTIC PROXIMITY SWITCH

BACKGROUND

The invention disclosed herein relates generally to proximity switches and more particularly to proximity switches that utilize fiber optics. There is a specific need in aircraft to sense the proximity of some movable part of an aircraft such as an aircraft door or a landing gear component. Due to considerations of size, weight and electromagnetic interference it is highly desirable to perform the proximity switch function using a single fiber optic link and a fiber optic switch.

In the past an optical fiber has been used as the communication link to an electrical proximity switch and support electronics. The state of the switch is converted back into a pulse of light which is transmitted back through the optical fiber and detected at the source end of the fiber link. This method requires a high power optical energy source and complicated support electronics at the location of the proximity switch. In addition electrical proximity switches generate electromagnetic interference which is undesirable in an aircraft environment.

Thus a need exists for a passive proximity switch that operates with a single fiber optic link.

SUMMARY OF THE INVENTION

The present invention solves these and other needs by providing a passive fiber-optic magnetometer that can be used to sense the proximity of a permanent magnet. The magnetometer includes a Michelson type interferometer, in which one of the legs is sensitized to magnetic fields, which is connected to a fiber-optic data link. A photo detector connected to the other end of the data link senses the reflected light. When the magnet comes within close proximity of the magnetometer, there is an intensity change in the back reflected light which is sensed by the photodetector. Thus the present invention can be used for example to sense the proximity of a magnet which is attached to a movable part of an aircraft.

Figure 1:
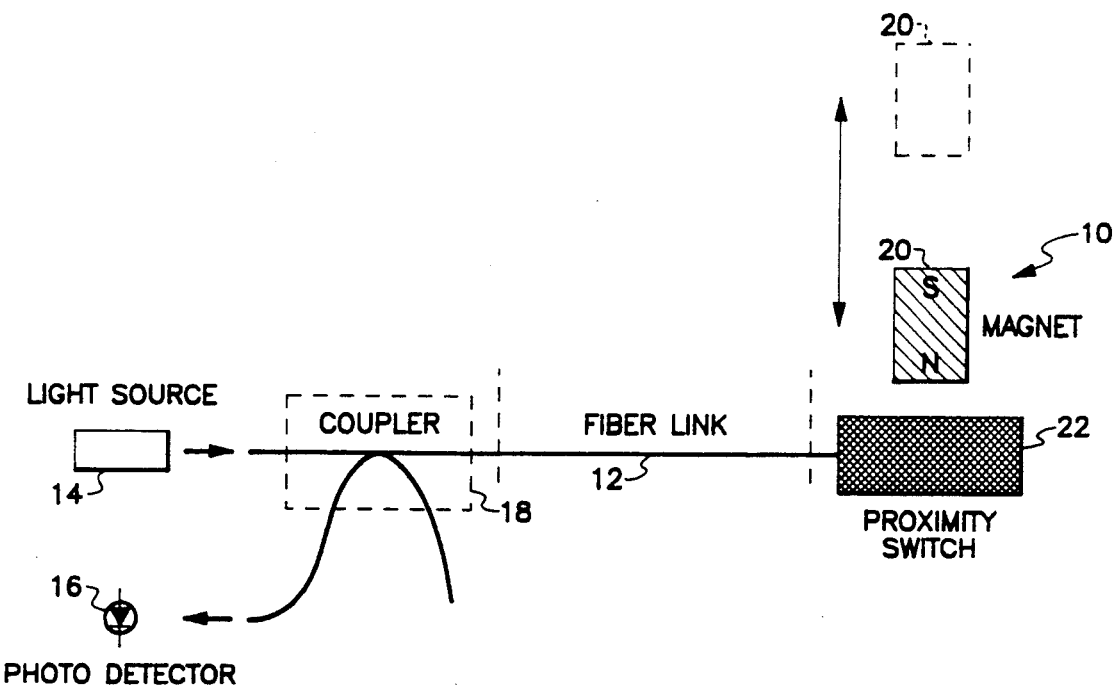
FIG. 1 is a schematic illustration of a fiber optic proximity switch in accordance with applicant's invention.

A passive fiber optic proximity switch is shown in the drawings and generally designated 10. Switch 10 is shown for use with a single fiber 12 which both supplies optical power to switch 10 and is the data link to determine the condition of switch 10.

Light source 14 may be a light emitting diode (LED) a laser diode or another suitable optical energy source Photodetector 16 may be a semiconductor junction photodiode.

Fiber coupler 18 is a single mode fiber coupler.

Proximity switch 10 includes a magnet 20 and a fiber optic magnetometer 22.

Magnetometer 22 includes a fiber coupler 24 that is connected to fiber link 12.

Fiber coupler 24 includes a single input and output leg 26, reference leg 28 and sensing leg 34.

Coupler 24 acts as a beam divider for incoming optical power entering leg 26. The incoming power is divided and travels into reference leg 28 or sensing leg 34.

End 32 of reference leg 28 and end 30 of sensing leg 34 are polished and metallized to be highly reflective.

A portion of sensing leg 34 is sensitized to magnetic fields by being attached to or coated with a magnetostrictive material 40.

Optical power entering input and output leg 26 is divided between reference leg 28 and sensing leg 34. Reflective end 32 and reflective end 38 will reflect the optical power and the reflected power from reference leg 28 and sensing leg 34 will be combined in coupler 24 and the combined or the resultant reflected power will be returned on the input and output leg 26. In accordance with applicants invention magnet 20 will be positioned in a first position adjacent sensing leg 34 or in a second position at a distance from sensing leg 34.

As best shown in FIG. 1 magnet 20 may be positioned in a first or "ON" position adjacent sensing leg 34. With magnet 20 in the first position the switch is in an "ON" state indicating the sensing of the proximity of a movable part of an aircraft, for example an aircraft door.

The "ON" state results from the constructive interference in coupler 24 of reflected light from reference leg 28 with reflected light from sensing leg 34. This reflected light travels along fiber link 12 and a portion of the reflected light is coupled by directional coupler 18 so that it will be detected at detector 16.

When magnet 20 is in the second position or spaced from sensing leg 34 the switch is in the "OFF" position indicating that the movable aircraft part is not in proximity to sensing leg 34.

Permanent magnet 20 is used to activate proximity switch 22. Since a permanent magnet is used the sensitivity of magnetometer 22 may be very low. The magnetic fields within close proximity of the magnet can be a few hundred Gauss to a few thousand Gauss.

As the magnetic field from magnet 20 is relatively strong the length of sensing leg 34 can be relatively short.

Figure 2:
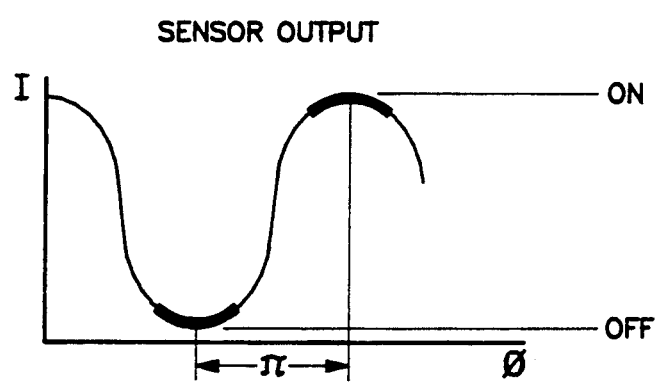
FIG. 2 is a diagrammatic illustration of the output of the fiber optic's proximity switch of FIG. 1.
Figure 3:
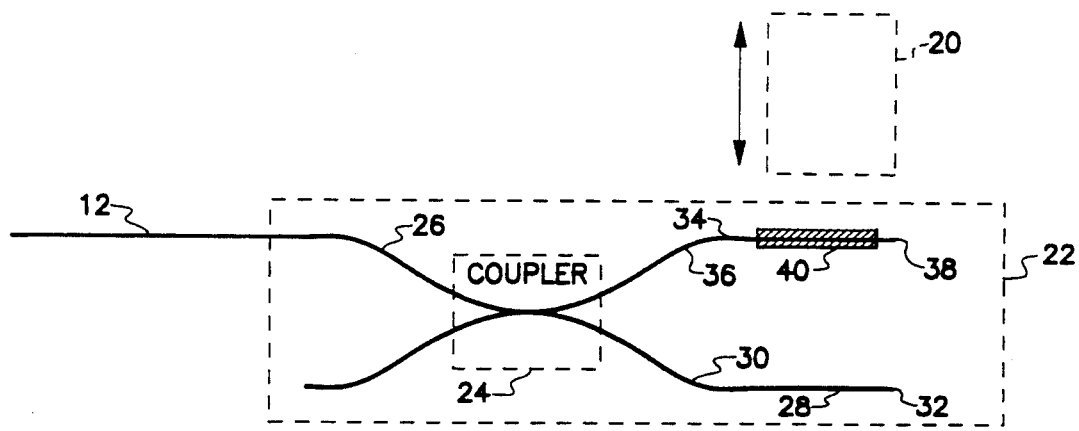
FIG. 3 is a detail illustration of the fiber optic proximity switch of FIG. 1

FIG. 2 is a plot of the light intensity I of the resultant reflected light as a function of the angle $\theta$ between the reflected light from sensing leg 34 and the reflected light from reference leg 28.

The light intensity will be a maximum when the angle $\theta$ is a multiple of $2\pi$. Light intensity will be a minimum when the angle $\theta$ is a multiple of $\pi$. Therefore the optical phase shift necessary to change the state of switch 10 from a minimum or "OFF" position to a maximum or "ON" position is $\pi$. The path length change or $\Delta L$ necessary to cause an optical phase shaft of $\pi$ can be shown as $$\Delta L = \frac{\lambda}{2}$$

where $\lambda$ is equal to the wavelength and for purposes of illustration can be assumed to be 0.8 $\mu$m and the path length change or $\Delta L$ is then 0.4 $\mu$m. A determination of the length of magnetostrictive material that will provide a phase shift of $\pi$ when driven to magnetic saturation may be made by assuming a particular material.

For example a cobalt nickel alloy has a magnetostrictive coefficient, $\epsilon$, of approximately $40 \times 10^{-6}$.

The length, $l_o$, of the magnetostrictive material may be calculated as follows:

$$l_o = \frac{\Delta l}{\epsilon} = \frac{0.4 \text{ m}}{10 \times 10^{-6}} = 1 \text{ cm}$$

The approximate length of the legs of the interferometer are 1 cm. This will result in a small compact transducer. The small size will make the thermal and accoustical effects easier to manage.

Figure 4:
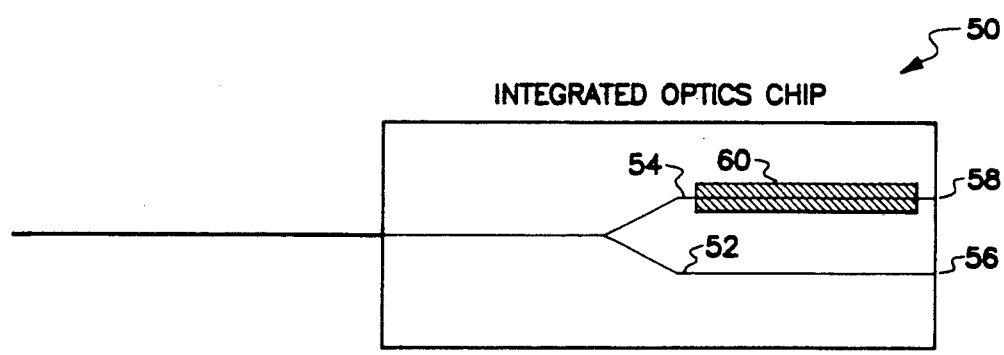
FIG. 4 is an illustration of the proximity switch formed in an integrated optics chip.

The present invention may be implemented by utilizing integrated fiber optic chip techniques for the passive fiber optic magnetometer 50 as shown in FIG. 4. Magnetometer 50 would include connection means for connection to input/output fiber 12. Magnetometer 50 would also include reference leg 52 and sensing leg 54. Reference leg 52 and sensing leg 54 would include mirror surfaces 56 and 58 respectively. Magnetostrictive material 60 is capable of altering the length of sensing leg 54 when it is subjected to a magnetic field.

In accordance with the foregoing description, applicant has developed a simple fiber optic proximity switch. Although a specific embodiment of the applicant's proximity switch is shown and described for illustrative purposes, a number of variations and modifications will be apparent to those of ordinary skill in the relevant arts. It is not intended that coverage be limited to the disclosed embodiment, but only by the terms of the following claims.

We claim:

1. A fiber optic proximity sensing system, comprising:
    an interferometer having a reference leg and a sensing leg, said sensing leg having a first predetermined length;
    said interferometer further having means for reflecting optical energy;
    a second predetermined length of magnetostrictive material secured to said sensing leg so that changes in said second predetermined length of said magnetostrictive material cause a change in said first predetermined length of said sensing leg;
    an optical energy source, said source providing the only energy required for operation of said proximity sensing system;
    an optical path for conveying said optical energy in a direction from said optical energy source to said interferometer and for conveying optical energy reflected from said reflecting means in an opposite direction;
    detection means responsive to the magnitude of said reflected optical energy; and
    a permanent magnet movable between a first position adjacent said interferometer with the magnetic field of said permanent magnet interacting with said magnetostrictive material to cause constructive interference of said optical energy within said interferometer to produce a first level of reflected optical energy sufficient to energize said detection means and a second position with said magnet spaced from said interferometer to cause destructive interference of said optical energy within said interferometer to produce a second level of reflected optical energy insufficient to energize said detection means.

2. The switch of claim 1 wherein said detection means comprises:
    a light sensitive detector; and
    means for coupling a portion of said reflected optical energy to said light sensitive detector.

3. The switch of claim 2 wherein said means for coupling comprises a directional coupler.

4. The switch of claim 3 wherein said light sensitive detector is a photodiode.

5. The switch of claim 4 wherein said optical energy source is a light emitting diode.

6. The switch of claim 5 wherein said optical path is an optical fiber.

7. The switch of claim 6 wherein said interferometer is a Michelson interferometer.

8. The switch of claim 1 wherein said interferometer and said second predetermined length of magnetostrictive material are included in a single integrated optic chip.

9. A proximity switch for use with a light source and a light detector, said light source being the only energy source required for operation of said proximity switch, comprising:
    a single optical fiber input leg having a first end and a second end, said second end coupled to said light source and to said light detector;
    an optical fiber reference leg having a first end and a second end, said second end having a coating for reflecting light;
    an optical fiber sensing leg having a first end, a second end, and a length said second end having a coating for reflecting light, at least a portion of said length being responsive to magnetic fields;
    an optical fiber directional coupler connected to and integral with said input leg first end, said reference leg first end, and said sensing leg first end for optically coupling said input leg, reference leg and sensing leg together with said light reflected from said sensing leg second end interfering with said light reflected from said reference leg second end to produce a resultant reflected light with said resultant reflected light being returned by said single optical fiber input leg for detection by said light detector; and
    a magnet movable between a first position adjacent said sensing leg with the magnetic field from said magnet interacting with said sensing leg to cause said reflected light from said second end of said sensing leg to constructively interfere with said reflected light from said second end of said reference leg and a second position with said magnet spaced from said sensing leg and said reflected light from said sensing leg second end destructively interfering with said reflected light from said reference leg second end.

10. The proximity switch of claim 9 wherein said first position of said magnet causes a first reflected light level sufficient to energize said light detector and said second position of said magnet causes a second reflected light level insufficient to energize said light detector.

11. The proximity switch of claim 9 wherein said single optical fiber input leg, said optical fiber reference leg, said optical fiber sensing leg and said optical fiber directional coupler are included in a single integrated optic chip.

12. A proximity sensing system, comprising:
    a light emitting source, said source providing the only energy required for operation of said proximity sensing system;
    a Michelson type fiber optic interferometer having a sensing leg and a reference leg;

a single fiber optic link interconnecting said interferometer with said light emitting source, said fiber optic length carrying emitted light in a direction from said light emitting source to said interferometer and carrying light reflected from said interferometer in an opposite direction;

means for detecting the magnitude of said reflected light;

said sensing leg of said interferometer further having a length said length being responsive to magnetic fields; and a magnet movable between a first position with said permanent magnet adjacent said interferometer to cause substantially constructive interference between reflected light from said sensing leg and reflected light from said reference leg and a second position spaced from said interferometer to cause substantially destructive interference between reflected light from said sensing leg and reflected light from said reference leg.

13. The proximity sensing system of claim 12 wherein magnetostrictive material is secured to said sensing leg.

14. The proximity sensing system of claim 13 wherein said means for detecting the magnitude of said reflected light is photodiode.

* * * * *

UNITED STATES PATENT AND TRADEMARK OFFICE
CERTIFICATE OF CORRECTION

PATENT NO. : 5,059,783
DATED      : October 22, 1991
INVENTOR(S): Lee K. Strandjord, Burlington, Mass.;
             Yellapu Anjan, Scottsdale, Ariz.

It is certified that error appears in the above-identified patent and that said Letters Patent is hereby corrected as shown below:

On the Title page, Item [75], cancel "Stranjord" and substitute -- Strandjord--.

Column 6, line 12, after "is" insert --a--.

Signed and Sealed this

Sixth Day of April, 1993

Attest:

STEPHEN G. KUNIN

*Attesting Officer*    Acting Commissioner of Patents and Trademarks